(12) United States Patent
Chung et al.

(10) Patent No.: US 7,463,073 B2
(45) Date of Patent: Dec. 9, 2008

(54) OUTPUT DRIVER

(75) Inventors: Hoe-ju Chung, Yongin-si (KR); Young-chan Jang, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 9 days.

(21) Appl. No.: 11/599,212

(22) Filed: Nov. 14, 2006

(65) Prior Publication Data

US 2007/0120582 A1    May 31, 2007

(30) Foreign Application Priority Data

Nov. 21, 2005   (KR) ................. 10-2005-0111501

(51) Int. Cl.
*H03B 1/00* (2006.01)
(52) U.S. Cl. ..................... 327/112; 327/108
(58) Field of Classification Search ............ 327/108, 327/112, 427, 437
See application file for complete search history.

(56) References Cited

U.S. PATENT DOCUMENTS

| | | | | |
|---|---|---|---|---|
| 5,936,456 A * | 8/1999 | Naka | ........................... | 327/437 |
| 6,097,223 A * | 8/2000 | Loughmiller | ................ | 327/112 |
| 6,130,563 A * | 10/2000 | Pilling et al. | ................. | 327/111 |
| 6,320,433 B1 * | 11/2001 | Hinterscher | .................. | 327/112 |
| 6,377,089 B1 * | 4/2002 | Loughmiller | ................ | 327/112 |
| 6,462,597 B2 * | 10/2002 | Lee | ............................. | 327/261 |
| 6,518,818 B1 * | 2/2003 | Hynes | ........................ | 327/333 |
| 6,693,842 B2 * | 2/2004 | Chung et al. | ........... | 365/230.06 |
| 7,205,807 B2 * | 4/2007 | Svensson et al. | ............ | 327/170 |
| 7,224,195 B2 * | 5/2007 | Pilling et al. | ................. | 327/112 |

FOREIGN PATENT DOCUMENTS

| | | |
|---|---|---|
| JP | 2003-101402 | 4/2003 |
| JP | 2003-309461 | 10/2003 |
| JP | 2004-228613 | 8/2004 |
| JP | 2004-312614 | 11/2004 |

* cited by examiner

*Primary Examiner*—Lincoln Donovan
*Assistant Examiner*—Hai L. Nguyen
(74) *Attorney, Agent, or Firm*—Mills & Onello LLP

(57) ABSTRACT

An output driver includes a pull-up unit including a pull-up element and a first inductive peaking element connected in series between a first voltage and an output node and a pull-down unit including a pull-down element and a second inductive peaking element connected in series between a second voltage and the output node. The pull-up and pull-down elements receive an input data signal and adjust a voltage level of the output node, and the first and second inductive peaking elements perform an inductive peaking operation when the input data signal transitions.

24 Claims, 11 Drawing Sheets

US 7,463,073 B2

OUTPUT DRIVER

CROSS-REFERENCE TO RELATED APPLICATION

This application is based on and claims priority from Korean Patent Application No. 10-2005-0111501 filed on Nov. 21, 2005, in the Korean Intellectual Property Office, the contents of which are incorporated herein in their entirety by reference.

BACKGROUND OF THE INVENTION

1. Technical Field

The present invention relates to an output driver and, more particularly, to an output driver having improved operation characteristics.

2. Description of the Related Art

Inter-Symbol Interference (ISI) is noise occurring when an output driver drives a large load (for example, a loading capacitor), and mainly occurs when a non-constant data signal pattern is output. In particular, it is a phenomenon in which the waveform of an output data signal is distorted in a channel because a currently output data signal is output before a previously output data signal has been sufficiently stabilized in the channel when the rising time and falling time of an output data signal are longer than the period of a clock signal. That is, the waveform of a current output data signal varies depending on the pattern of a previous output data signal.

FIG. 1 is a diagram illustrating the waveform of an output data signal attributable to ISI.

Referring to FIG. 1, an output data signal DOUT swings between a voltage level VOL and a voltage level VOH in an interval (interval $\Delta t1$) in which an input data signal DIN continuously toggles between a low level and a high level. In this case, when there is a large load (a loading capacitor and a resistor) in an output node and operation speed is high, the swing of an output data signal may be restricted. However, the level of the output data signal DOUT continuously increases above the voltage level VOH by $\Delta V$ in an interval ($\Delta t2$) in which the input data signal DIN is continuously at a low level. Therefore, the output data signal DOUT swings between a voltage level VOL+$\Delta V$ and a voltage level VOH+$\Delta V$ in an interval ($\Delta t3$) in which the input data signal DIN continuously toggles between the low level and the high level. As described above, the output data signal DOUT has different waveforms in the intervals $\Delta t1$ and $\Delta t3$, so that data signal pattern-dependent skew occurs. As a result, a timing margin and a voltage margin decrease in a receiver receiving the output data signal DOUT.

In FIG. 1, reference character VH designates the maximum output voltage of the output driver, reference character VL designates the minimum output voltage thereof, and reference character VTH designates a logic threshold voltage.

In order to overcome the problems, an output driver, which performs a pre-emphasis operation, has been conventionally used. The output driver includes a main driver for receiving a currently input data signal, a pre-emphasis driver connected in parallel to the main driver and configured to receive a previously input data signal, and a storage block for storing the previously input data signal. As a result, the conventional output driver further includes the pre-emphasis driver and the storage block, so that the size thereof is large and current for operating the pre-emphasis driver and the storage block is additionally required, thereby increasing power consumption.

SUMMARY OF TH INVENTION

In accordance with an aspect of the present invention, an output driver includes a pull-up unit including a pull-up element and a first inductive peaking element connected in series between a first voltage and an output node; and a pull-down unit including a pull-down element and a second inductive peaking element connected in series between a second voltage and the output node. The pull-up and pull-down elements receive an input data signal and adjust a voltage level of the output node, and the first and second inductive peaking elements perform an inductive peaking operation when the input data signal transitions.

In one embodiment, the pull-up element is a first PMOS transistor, a gate of which receives the input data signal.

In one embodiment, the pull-down element is a first NMOS transistor, a gate of which receives the input data signal.

In one embodiment, the first inductive peaking element is a second NMOS transistor which is connected between the pull-up element and the output node, and a gate of which is connected to a third voltage through a first resistor. In one embodiment, a level of the third voltage is higher than a level of the first voltage. In one embodiment, the level of the third voltage is higher than the level of the first voltage by about 0.5~1 V. In one embodiment, the level of the third voltage varies depending on a first pre-emphasis control signal. In one embodiment, a resistance of the first resistor varies depending on a second pre-emphasis control signal. In one embodiment, the first resistor comprises a plurality of first sub-resistors connected in parallel, the plurality of first sub-resistors being selectively connected to the third voltage according to a second pre-emphasis control signal.

In one embodiment, the second inductive peaking element is a second PMOS transistor which is connected between the pull-down element and the output node, and a gate of which is connected to a fourth voltage through a second resistor. In one embodiment, a level of a fourth voltage is lower than a level of the second voltage. In one embodiment, the level of the fourth voltage is lower than the level of the second voltage by about 0.5~1 V.

In one embodiment, a level of a fourth voltage varies depending on a third pre-emphasis control signal.

In one embodiment, a resistance of the second resistor varies depending on a fourth pre-emphasis control signal.

In one embodiment, the second resistor includes a plurality of second sub-resistors connected in parallel, the plurality of second sub-resistors being selectively connected to the fourth voltage according to the fourth pre-emphasis control signal.

In one embodiment, the first inductive peaking element includes a third PMOS transistor which is connected between the pull-up element and the output node, and a gate of which is connected to the first voltage through a first capacitor, and a third resistor which is connected between the gate of the third PMOS transistor and the output node.

In one embodiment, the second inductive peaking element includes a third NMOS transistor which is connected between the pull-down element and the output node, and a gate of which is connected to the second voltage through a second capacitor, and a fourth resistor which is connected between the gate of the third NMOS transistor and the output node.

In accordance with another aspect of the present invention, an output driver includes a first PMOS transistor which is connected between a first voltage and a first node, and a gate of which receives an input data signal; a first NMOS transistor which is connected between a second voltage and a second node, and a gate of which receives the input data signal; a second NMOS transistor which is connected between the first node and an output node, and a gate of which is connected to a third voltage through a first resistor, and a second PMOS transistor which is connected between the second node and the output node, and a gate of which is connected to a fourth voltage through a second resistor.

In one embodiment, a level of the third voltage is higher than a level of the first voltage.

In one embodiment, a level of the third voltage varies depending on a first pre-emphasis control signal.

In one embodiment, a resistance of the first resistor varies depending on a second pre-emphasis control signal.

In one embodiment, a level of the fourth voltage is lower than a level of the second voltage.

In one embodiment, a level of the fourth voltage varies depending on a third pre-emphasis control signal.

In one embodiment, a resistance of the second resistor varies depending on a fourth pre-emphasis control signal.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention.

DESCRIPTION OF THE PREFERRED EMBODIMENTS

Figure 2:
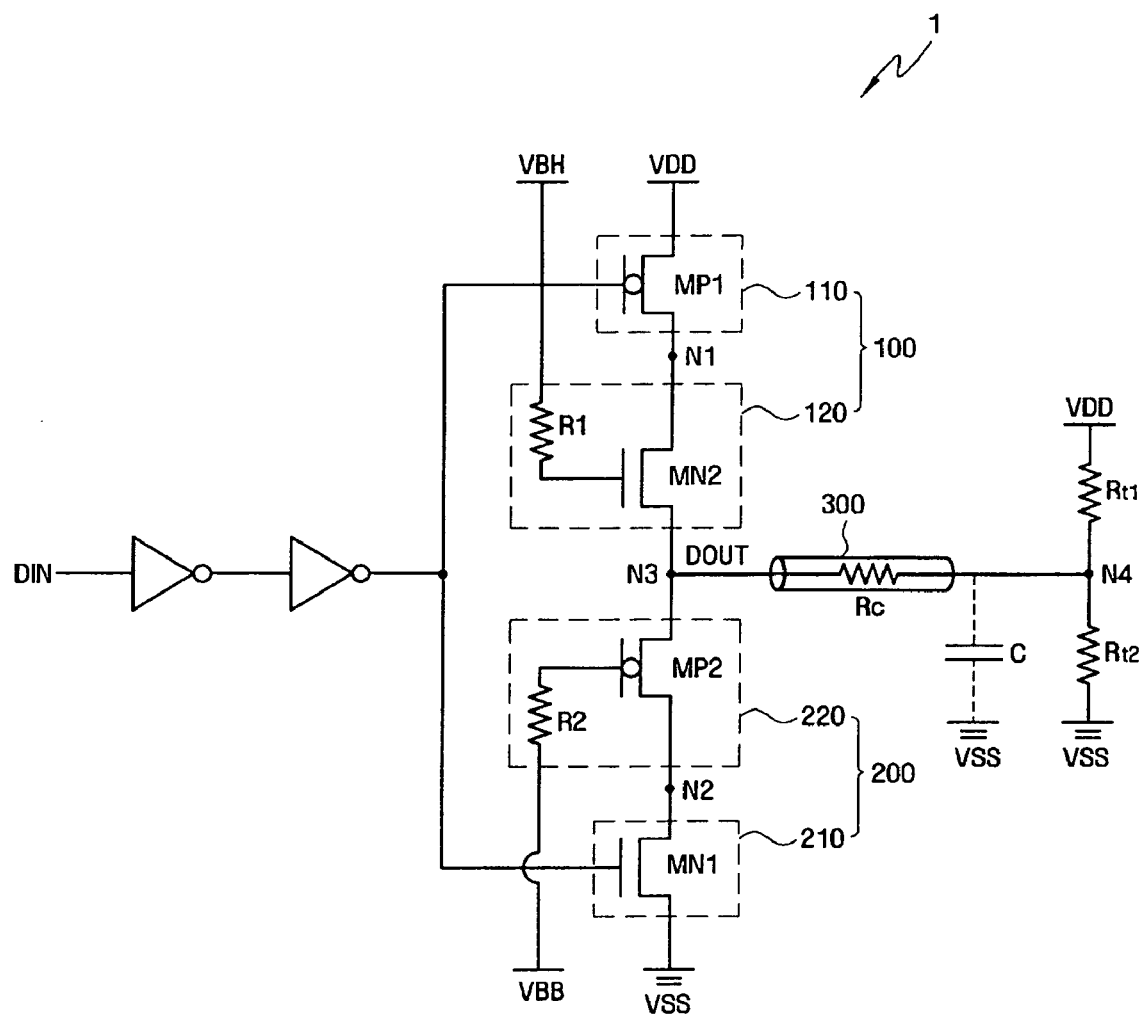
FIG. 2 is a circuit diagram illustrating an output driver according to an exemplary embodiment of the present invention.

FIG. 2 is a circuit diagram illustrating an output driver according to an exemplary embodiment of the present invention.

Referring to FIG. 2, the output driver 1 according to the embodiment of the present invention includes a pull-up unit 100 which includes a pull-up element 110 and a first inductive peaking element 120 connected in series between a first voltage (for example, a power supply voltage VDD) and an output node N3, and a pull-down unit 200 which includes a pull-down element 210 and a second inductive peaking element 220 connected in series between a second voltage (for example, a ground voltage VSS) and the output node N3.

The pull-up element 110 and the pull-down element 210 receive an input data signal DIN and adjust the voltage level of the output node N3.

For example, the pull-up element 110 may be a first PMOS transistor MP1 which is connected between the first voltage, for example, the power supply voltage VDD, and a first node N1, and the gate of which receives the input data signal DIN. The pull-down element 210 may be a first NMOS transistor MN1 which is connected between the second voltage, for example, the ground voltage VSS, and a second node N2, and the gate of which receives the input data signal DIN. In FIG. 2, it is shown that the input data signal DIN is buffered through two inverters and is then input to the gates of the first PMOS transistor MP1 and the first NMOS transistor MN1, but the present invention is not limited to this specific exemplary configuration.

The first and second peaking elements 120, 220 perform an inductive peaking operation when the input data signal DIN changes from a high level to a low level or from the low level to the high level.

In particular, a resistor Rc and a loading capacitor C, which act as a low pass filter, are connected to the output node N3 of the output driver 1. For example, the resistor Rc may be the resistor of a channel 300, and the loading capacitor C may be the capacitor of a pad which connects the capacitor of the pin of a semiconductor chip package, a die and a substrate with wire bonding. In the present invention, an element which acts as a high pass filter is equipped with an output driver, thereby canceling the effect of the low pass filter. Therefore, in order to implement the high pass filter, inductance is implemented between the first node N1 and the output node N3, and between the second node N2 and the output node N3.

An example of such implementation is described. The first inductive peaking element 120 may include a second NMOS transistor MN2 which is connected between the first node N1 and the output node N3, and the gate of which is connected to a third voltage through a first resistor R1. In this case, the level of the third voltage may be higher than the level of the first voltage (in FIG. 2, reference character VBH). In particular, the level of the third voltage may be higher than the level of the first voltage by about 0.5~1 V, but is not limited to this. That is, as the level of the third voltage increases, the inductive peaking operation is performed well. However, when excessively high voltage is used, the reliability of a semiconductor device using the output driver 1 may become low, so the level of the third voltage is adjusted in consideration of this.

The second inductive peaking element 220 may include a second PMOS transistor MP2 which is connected between the second node N2 and the output node N3, and the gate of which is connected to a fourth voltage through a second resistor R2. In this case, the level of the fourth voltage may be lower than the level of the second voltage (in FIG. 2, reference character VBB). In particular, the level of the fourth voltage may be lower than the level of the second voltage by about 0.5~1 V, but is not limited to this. That is, as the level of the fourth voltage decreases, the inductive peaking operation is performed well. However, when excessively low level voltage is used, the reliability of a semiconductor device using the output driver 1 may become low, so the level of the fourth voltage is adjusted in consideration of this.

The implementation of inductance using the first inductive peaking element 120 is described with reference to FIGS. 3A to 3C.

Figure 3A:
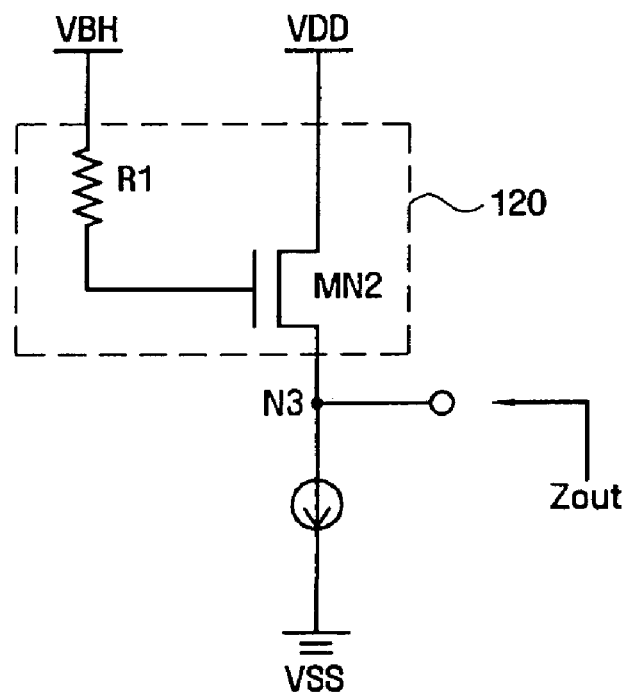
FIGS. 3A to 3C are diagrams illustrating the inductive peaking element of FIG. 2.

In FIG. 3A, the first inductive peaking element 120 of the output drivers of FIG. 2 is only illustrated for the convenience of description, and the remaining parts are illustrated as a current source.

Figure 3B:
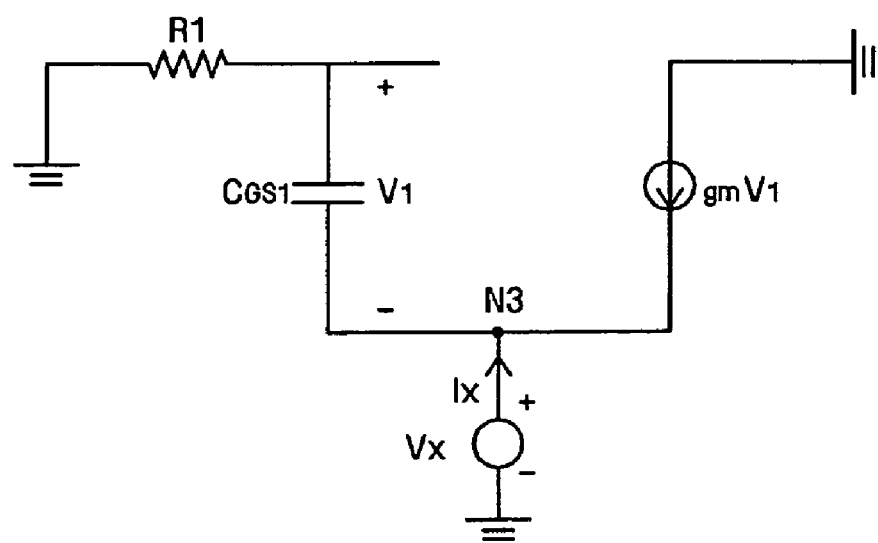

FIG. 3B is a diagram illustrating the case in which voltage power Vx is applied to the output node N3 in order to acquire a Thevenin equivalent impedance seen from the output node N3.

Referring to FIG. 3B, $C_{GS1}$ means the capacitance of the gate-source overlap capacitor of the second NMOS transistor MN2. When the voltage across both nodes of $C_{GS1}$ is $V_1$, the current source is represented as $g_m V_1$ ($g_m$ is transconductance).

Ignoring the gate-drain overlap capacitor, source-bulk capacitor, channel-length modulation, body effect of the second NMOS transistor MN2, Equation 1 is obtained as follows:

$$sV_1 C_{GS1} + g_m V_1 = -Ix$$

$$sV_1 C_{GS1} R1 + V_1 = -Vx \quad (1)$$

Using Equation 1, the Thevenin equivalent impedance can be acquired as Equation 2:

$$Zout = \frac{sR1 C_{GS1} + 1}{g_m + sC_{GS1}} \quad (2)$$

where it can be known that $|Zout(s=0)|=1/g_m$ and $|Zout(s=\infty)|=R1$. Therefore, when $R1 \propto 1/g_m$, $|Zout|$ increases with a frequency that indicates an inductance characteristic.

Figure 3C:
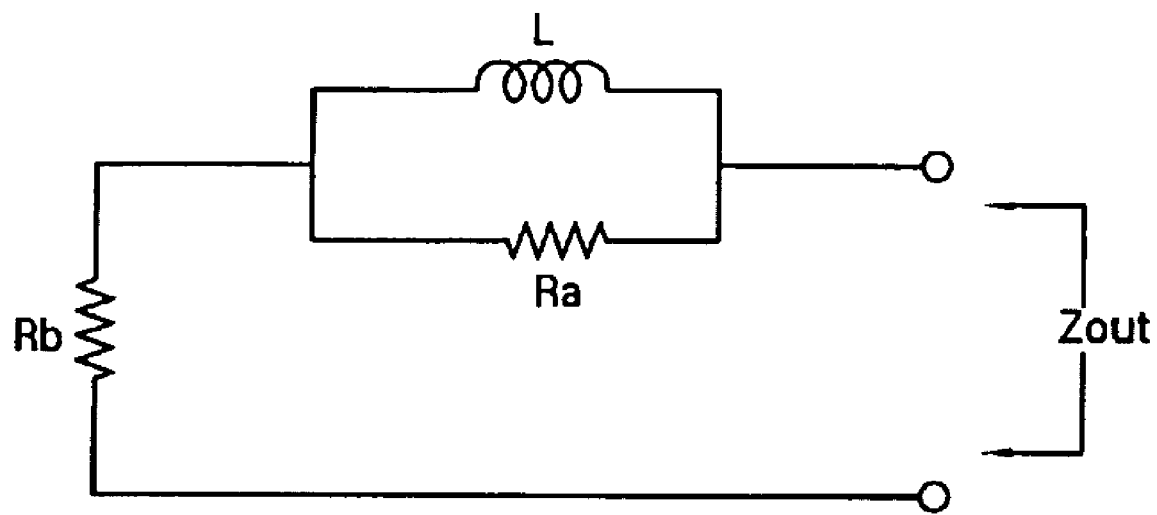

In particular, Zout can be modeled using Ra, Rb, and L of the following Equation 3 as in FIG. 3C.

$$L = \frac{C_{GS1}}{g_m}\left(R1 - \frac{1}{g_m}\right) \quad (3)$$

$$Ra = R1 - \frac{1}{g_m}$$

$$Rb = \frac{1}{g_m}$$

In order to achieve high quality inductance, Ra must be maximized and Rb must be minimized. That is, with reference to Equation 3, it is known that $g_m$ and R1 must be maximized.

Referring to FIG. 2 again, the reflection of a data signal can be suppressed by adjusting the on-resistor of the second NMOS transistor MN2 of the first inductive peaking element 120, and the on-resistor of the second PMOS transistor MP2 of the second inductive peaking element 220 is matched to the characteristic impedance of the channel 300.

Furthermore, the reflection of the data signal can be prevented by a first termination resistor $R_{t1}$ formed between a power supply voltage VDD and a reception node N4, and a second termination resistor $R_{t2}$ formed between and the reception node N4 and a ground voltage VSS.

Figure 4A:
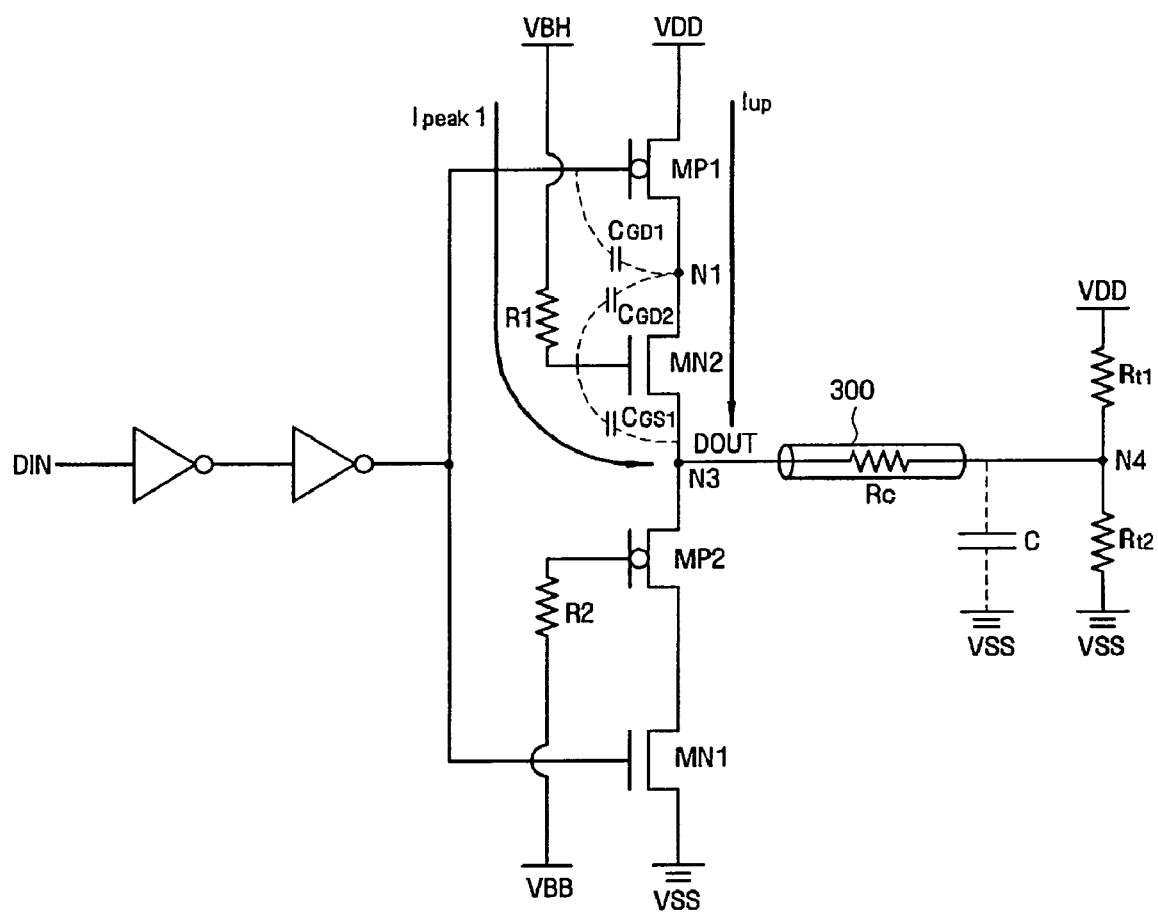
FIGS. 4A and 4B are diagrams qualitatively illustrating the inductive peaking operation of the output driver according to the embodiment of the present invention.
Figure 4B:
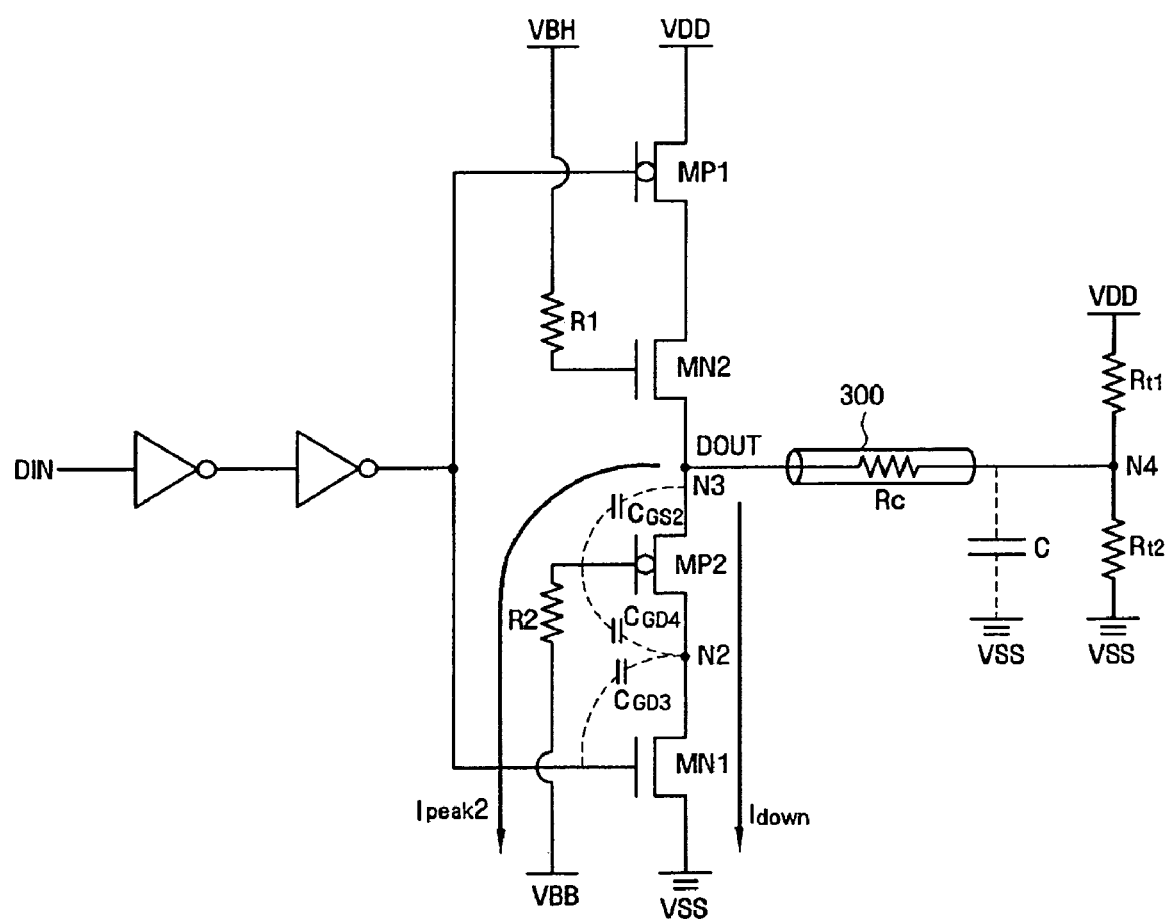
Figure 5A:
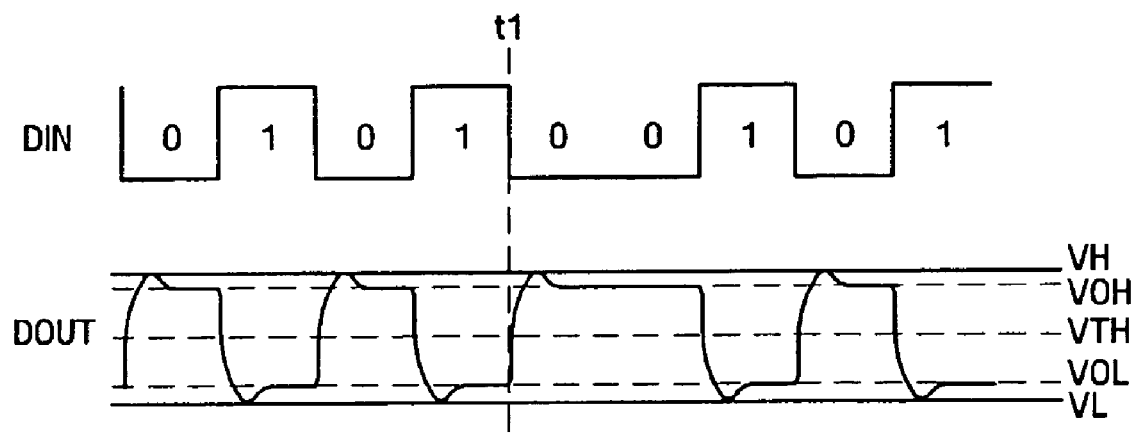
FIGS. 5A and 5B are diagrams illustrating the waveforms of the output data signal of the output driver according to the embodiment of the present invention.
Figure 5B:
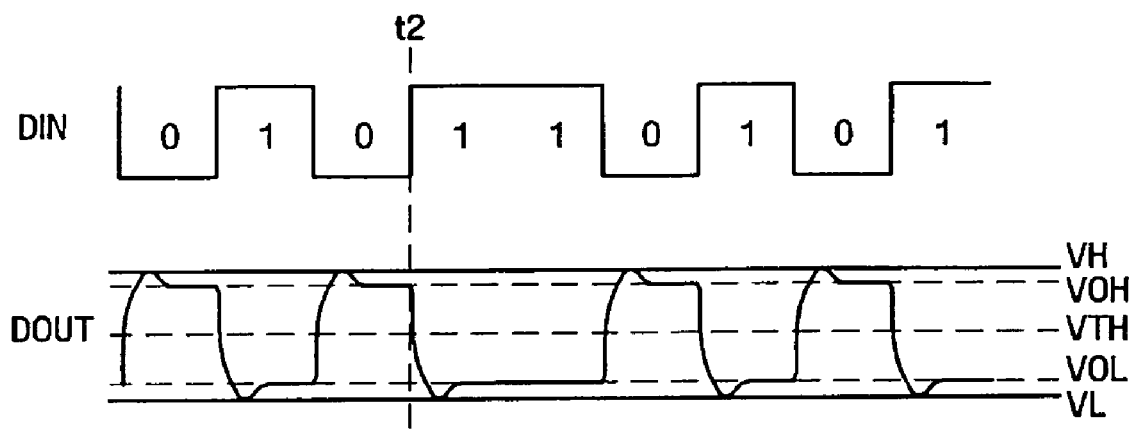

FIGS. 4A and 4B are diagrams qualitatively illustrating the inductive peaking operation of the output driver of the embodiment of the present invention. FIGS. 5A and 5B are diagrams illustrating the waveforms of the output data signal of the output driver according to the embodiment of the present invention.

FIG. 4A illustrates the gate-drain overlap capacitor $C_{GD1}$ of the first PMOS transistor MP1 for convenience of description.

Referring to FIGS. 4A and 5A, when time t1 is reached, the input data signal DIN changes from a high level to a low level, so that the gate node of the first PMOS transistor MP1 has a low level. In this case, since the gate node of the first PMOS transistor MP1 has a low level, the first node N1 also has the low level due to a gate-drain overlap capacitor $C_{GD1}$. The reason for this is that the input data signal DIN includes an AC component and the capacitor can deliver the AC component because the time point t1 is the time point where the level of the input data signal DIN changes from a high level to a low level. Furthermore, the gate node of the second NMOS transistor MN2 also has a low level due to the gate-drain overlap capacitor $C_{GD2}$ of the second NMOS transistor MN2. Therefore, a potential difference occurs between VBH and the gate node of the second NMOS transistor MN2. In this case, since the output node N3 still has a low level because the input data signal DIN has previously had a high level, current Ipeak1 flowing in the direction from VBH to the gate node of the second NMOS transistor MN2 and the output node N3 is formed. The higher the voltage level of VBH, the larger current Ipeak1.

The gate node of the first PMOS transistor MP1 has a low level and then the first PMOS transistor MP1 is turned on, so that current Iup flowing in the direction from the first voltage, which is VDD, to the output node N3 is formed.

In summery, since current Ipeak1 is separately formed at the time point at which the level of the input data signal DIN changes from a high level to a low level, besides current Iup, the voltage level of the output node N3 can rapidly increase, compared to a conventional output driver.

Furthermore, at the transition point, the voltage level of the output node N3 can increase to the maximum output voltage VH of the output driver as illustrated in FIG. 5A (that is, a peak is formed). When the transition point is terminated, current Ipeak1 is not reached, so that the voltage level of the output node N3 is stabilized at VOH voltage level.

Referring to FIGS. 4B and 5B, when time t2 is reached, the input data signal DIN changes from a low level to a high level, so that the gate node of the first NMOS transistor MN1 has a high level. In this case, the gate node of the first NMOS transistor MN1 has a high level, so that the second node also has a high level due to the gate-drain overlap capacitor $C_{GD3}$. The reason for this is that the input data signal DIN includes an AC component and the capacitor can deliver the AC component because time point t2 is the time point where the level of the input data signal DIN changes from a low level to a high level. Furthermore, the gate node of the second PMOS transistor MP2 also has a high level due to the gate-drain overlap capacitor $C_{GD4}$ of the second NPOS transistor MP2. Therefore, potential difference occurs between the gate node of the second PMOS transistor MP2 and VBB. In this case, since the output node N3 still has a high level because the input data signal DIN has previously had a low level, current Ipeak2 flowing in the direction from the output node N3 to the gate node of the second PMOS transistor MP2 and VBB is formed.

The gate node of the first NMOS transistor MN1 has a high level and then the first NMOS transistor MN1 is turned on, so that current Idown in the direction from the output node N3 to the second voltage, which is VSS, is formed.

In summery, since current Ipeak2 is separately formed at the time point at which the level of the input data signal DIN changes from a low level to a high level, besides current Idown, the voltage level of the output node N3 can rapidly decrease, compared to a conventional output driver.

Furthermore, at the transition point, the voltage level of the output node N3 can drop to the minimum output voltage VL of the output driver, as illustrated in FIG. 5B (that is, a peak is formed). When the transition point is terminated, current Ipeak2 is not formed, so that the voltage level of the output node N3 is stabilized at VOL voltage level.

As a result, the data signal pattern-dependent skew can decrease and thus the timing margin and voltage margin in a receiver which receives the output data signal DOUT can increase.

Figure 1:
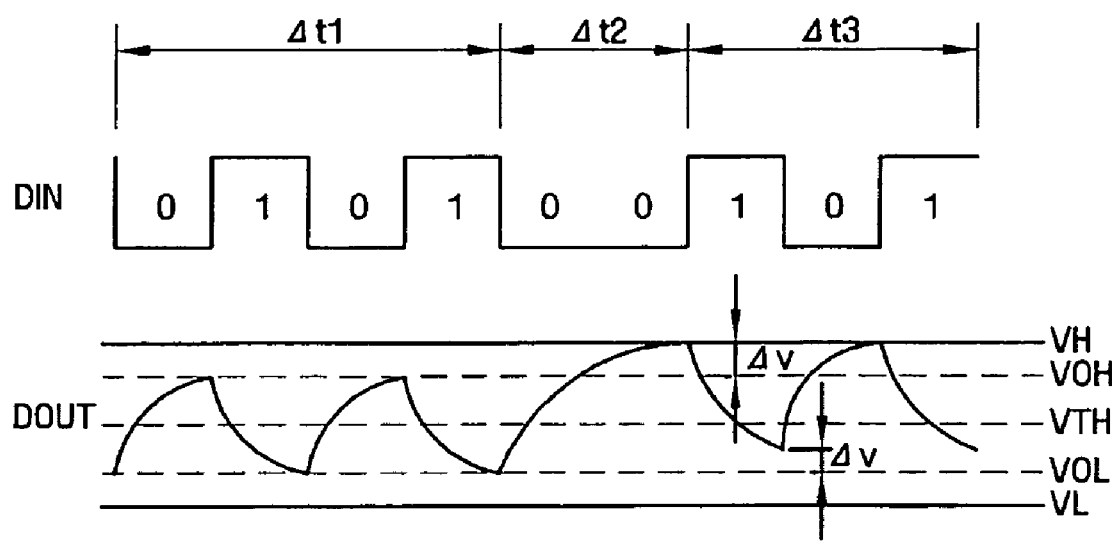
FIG. 1 is a diagram illustrating the waveform of an output data signal attributable to ISI.

Furthermore, unlike a conventional output driver, in which a main driver and a pre-emphasis driver are connected in parallel, a separate pre-emphasis driver is not used, so that the size thereof is small. In particular, the pull-up and pull-down elements (110 and 210 of FIG. 1) are respectively connected in series to the first and second inductive peaking elements (120 and 220 of FIG. 1), so that the size thereof can decrease.

Furthermore, the first and second inductive peaking elements (120 and 220), which perform a pre-emphasis function, consume small current only upon the transition of the input data signal DIN, so that current consumption is smaller than the conventional output driver.

Figure 6:
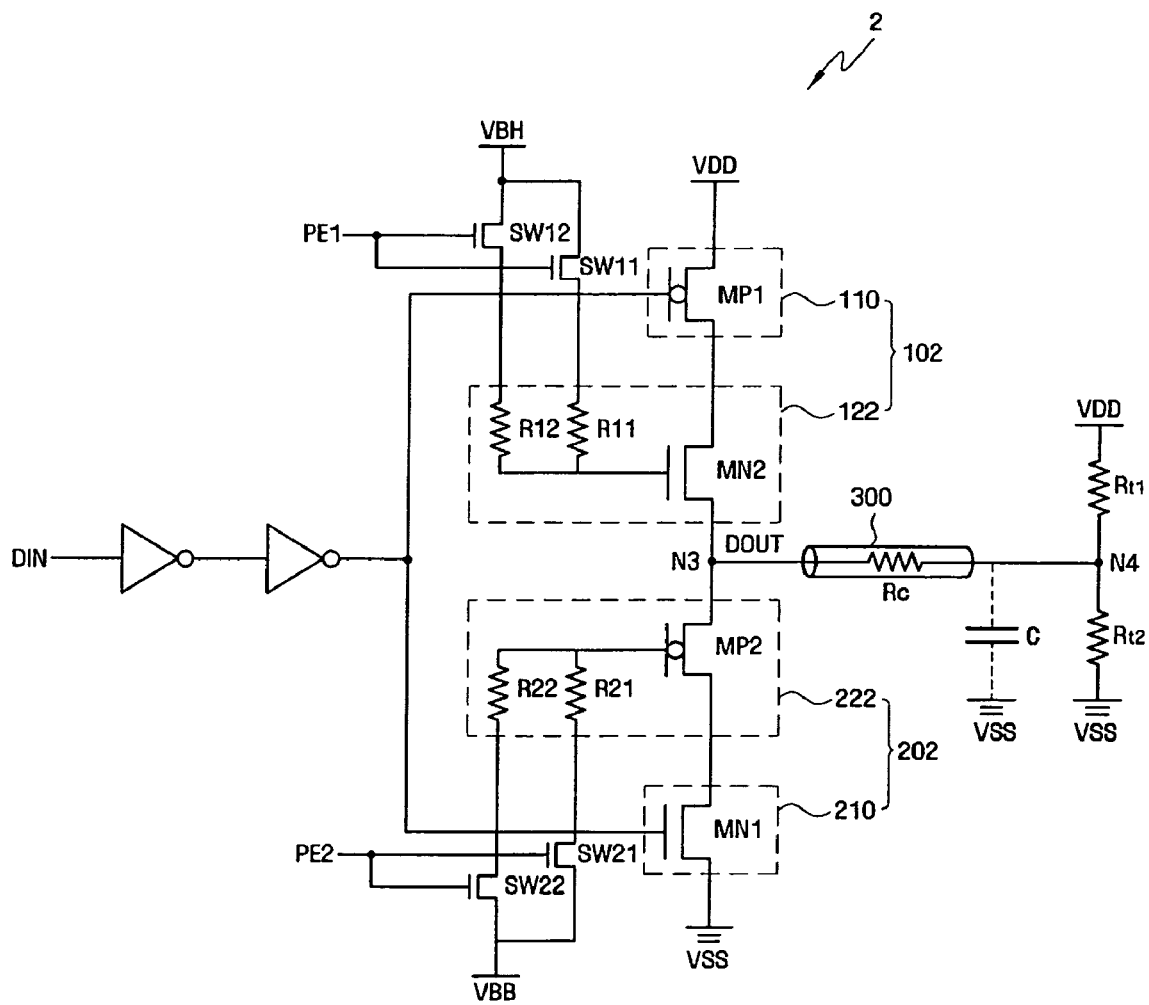
FIG. 6 is a circuit diagram illustrating an output driver according to another exemplary embodiment of the present invention.

FIG. 6 is a circuit diagram illustrating an output driver according to another exemplary embodiment of the present invention. The same reference numerals are used for components substantially the same as in FIG. 2, and detailed descriptions thereof are not repeated.

Referring to FIG. 6, in the output driver of another embodiment of the present invention, the resistances of first and second resistors (R1 and R2 of FIG. 2) respectively vary depending on first and second pre-emphasis control signals (PE1 and PE2).

As described with reference to FIG. 3, in order to implement high quality inductance, the first and second resistors are adjusted to meet the characteristics of a semiconductor integrated circuit device.

As a result, in another embodiment of the present invention, the first resistor R1 includes a plurality of first sub-resistors R11 and R12 connected in parallel. The plurality of first sub-resistors R11 and R12 is selectively connected to the third voltage (for example, VBH) through switching transistors SW1 and SW2 gated by the first pre-emphasis control signal PE1.

Furthermore, the second resistor R2 includes a plurality of second sub-resistors R21 and R22 connected in parallel. The plurality of second sub-resistors R21 and R22 is selectively connected to the fourth voltage (for example, VBB) through switching transistors SW21 and SW22 gated by the second pre-emphasis control signal PE2.

In another embodiment of the present invention, the case in which the first and second resistors R1 and R2 are respectively composed of two of first and second sub-resistors R11, R12, R21 and R22 is described as an example, but one of ordinary skill in the art will appreciate that four or eight first and second sub-resistors can be used.

Figure 7:
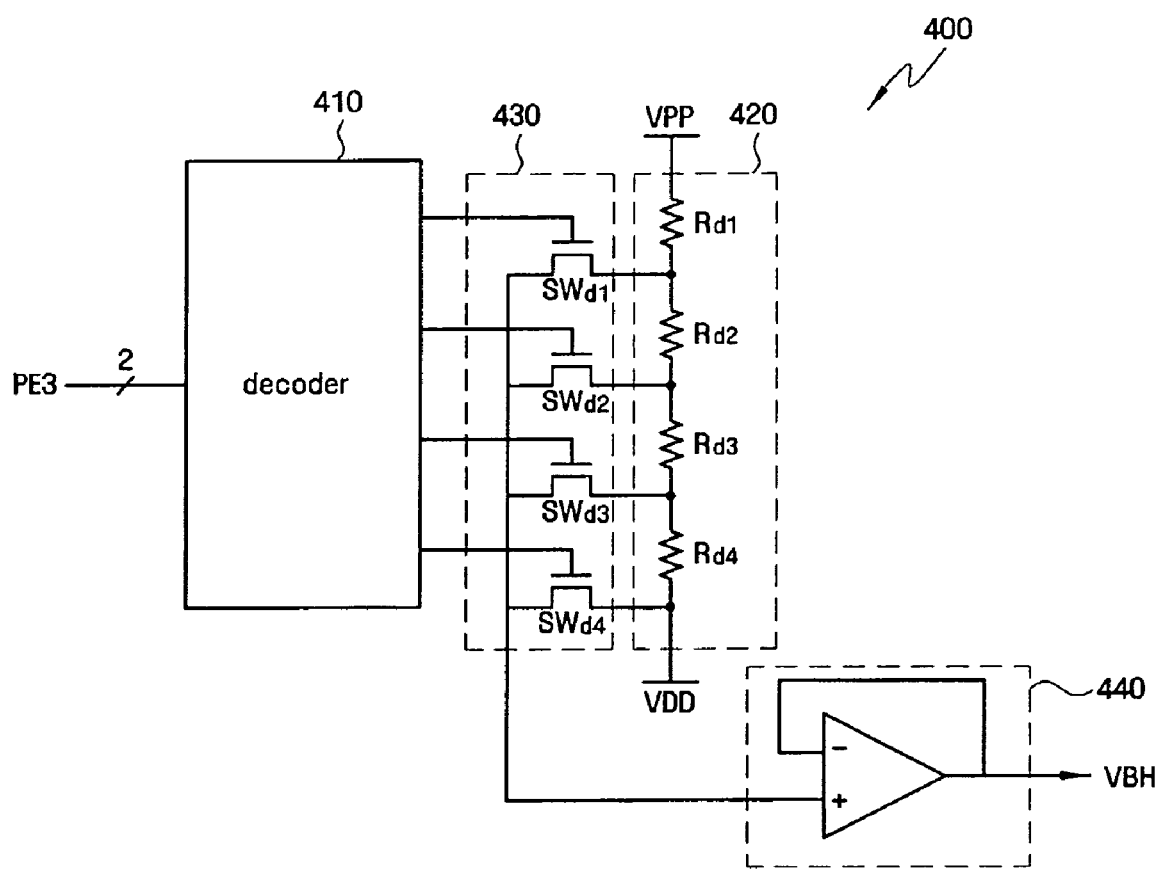
FIG. 7 is a circuit diagram illustrating an output driver according to still another exemplary embodiment of the present invention.

FIG. 7 is a circuit diagram illustrating an output driver according to still another exemplary embodiment of the present invention. The same reference numerals are used for components that are substantially the same as in FIG. 2, and detailed descriptions thereof are not repeated.

In the output driver of FIG. 7, the level of the third voltage (for example, VBH) varies depending on a third pre-emphasis control signal PE3, and the level of the fourth voltage (for example, VBB) varies depending on a fourth pre-emphasis control signal PE4. In FIG. 7, a circuit which adjusts the level of the third voltage is described as an example, but this can be applied to a circuit which adjusts the level of the fourth voltage.

Referring to FIG. 7, the third voltage adjustment circuit 400 includes a decoder 410, a resistor row 420, a switching unit 430, and a buffer 440.

The decoder decodes the third pre-emphasis control signal PE3.

The resistor row has a plurality of resistors $R_{d1}$, $R_{d2}$, $R_{d3}$, and $R_{d4}$ connected in series between a boost voltage VPP and a power supply voltage VDD. Each of node voltages between respective resistors $R_{d1}$, $R_{d2}$, $R_{d3}$, and $R_{d4}$ can be used as the third voltage. Each of node voltages can be acquired by a voltage divider rule For example, the node voltage between nodes $R_{d2}$ and $R_{d3}$ can be acquired as follows:

$$V_{Rd2-Rd3} = Vdd * \left\{ \frac{R_{d3} + R_{d4}}{R_{d1} + R_{d2} + R_{d3} + R_{d4}} \right\} \quad (4)$$

The switching unit 430 is connected to nodes between resistors $R_{d1}$, $R_{d2}$, $R_{d3}$, and $R_{d4}$ and the buffer 440, and includes a plurality of switches $SW_{d1}$, $SW_{d2}$, $SW_{d3}$, and $SWR_{d4}$ gated by the decoded third pre-emphasis control signal, thereby selectively delivering node voltages to the buffer 440.

Figure 8:
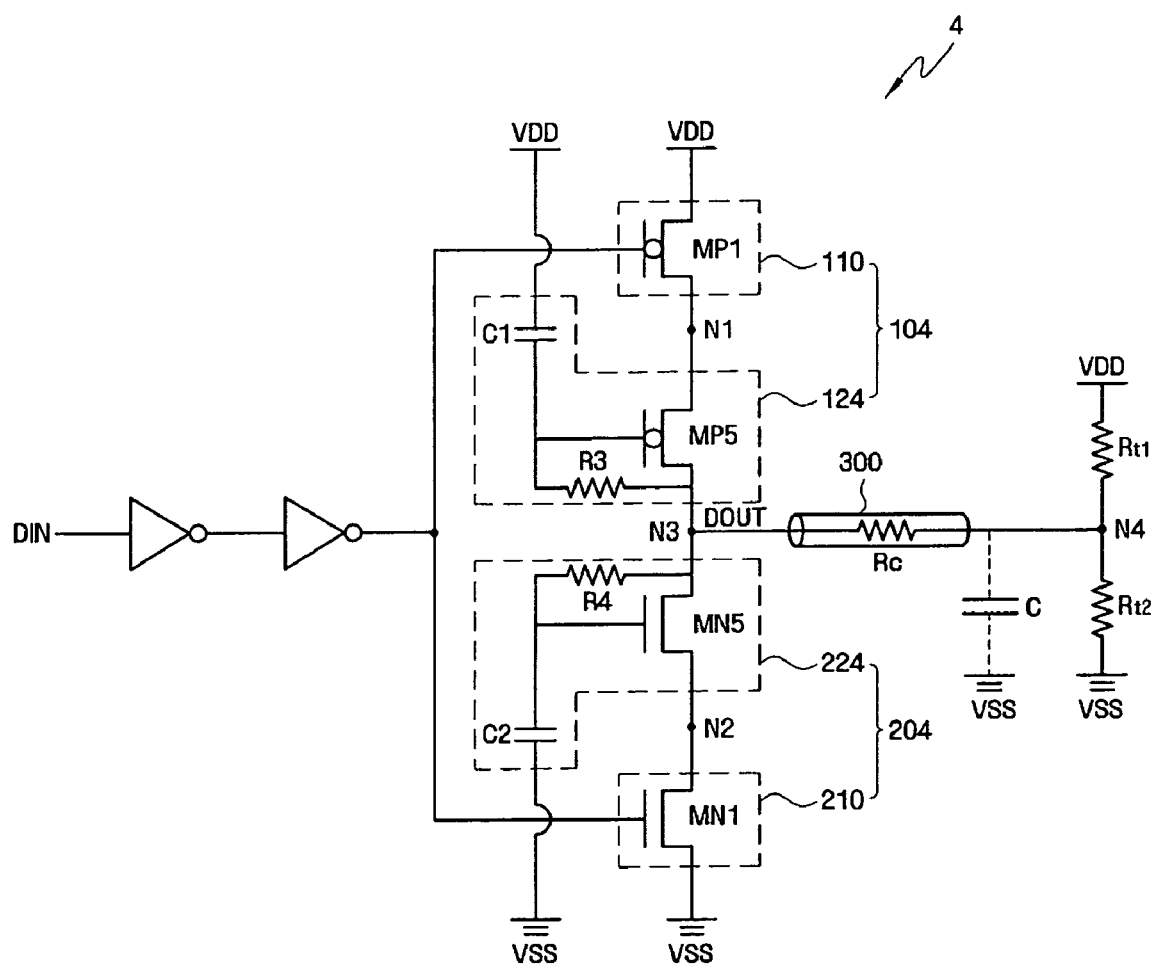
FIG. 8 is a circuit diagram illustrating an output driver according to still another exemplary embodiment of the present invention.

FIG. 8 is a circuit diagram illustrating an output driver according to still another exemplary embodiment of the present invention. The same reference numerals are used for components that are substantially the same as in FIG. 2, and detailed descriptions thereof are not repeated.

Referring to FIG. 8, in the output driver 4 according to still another embodiment of the present invention, the first inductive peaking element 124 includes a fifth PMOS transistor MP5 which is connected between the first node N1 and the output node N3, and the gate of which is connected to the first voltage through the first capacitor C1, and a third resistor R3 connected between the gate of the fifth PMOS transistor MP5 and the output node N3.

The second inductive peaking element 224 includes a fifth NMOS transistor MN5 which is connected between the second node N2 and the output node N3, and the gate of which is connected to the second voltage through the second capacitor C2, and a fourth resistor R4 connected between the gate of the fifth NMOS transistor MN5 and the output node N3.

A detailed description of the present invention is given through the following specific experiments. Un-described content has been omitted herein because those having ordinary technical skill in the art can appreciate it.

EXPERIMENTAL EXAMPLE

An output driver was implemented as shown in FIG. 2, with the capacitance of a loading capacitor being 5 pF, and first and second termination resistors being respectively 100Ω. Simulation was performed using HSPICE simulator while the resistances of the first and second resistors of first and second inductive peaking elements varied.

COMPARISON EXAMPLE

An output driver which includes only pull-up and pull-down elements without including first and second inductive peaking elements was simulated using HSPICE.

Figure 9:
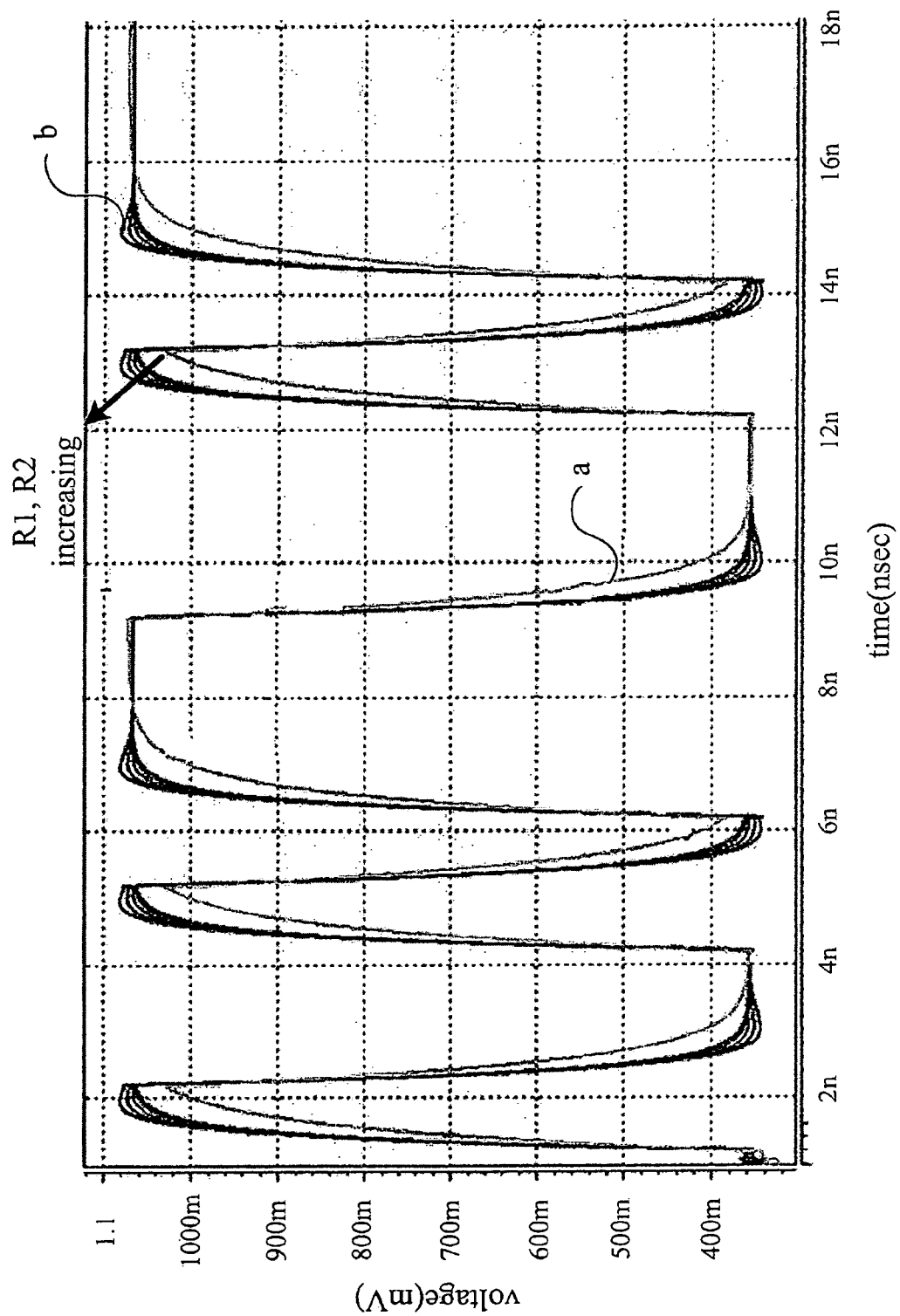
FIG. 9 is a diagram illustrating simulation results obtained while the resistances of the first and second resistors of first and second inductive peaking elements vary.

FIG. 9 illustrates simultaneously the experimental and comparison examples.

Referring to FIG. 9, the x axis represents time (nsec) and the y axis represents voltage (mV). In the comparison example, it can be known that ISI occurs, and, when a low level input data signal is continuously input, an output data signal continuously increases. That is, it can be known that the output data signal swings between about 360 mV and about 1020 mV when the high and low level input data signals are repetitively input, whereas the output data signal swings between about 380 mV and about 1060 mV when the low level input data signal is continuously input.

In contrast, it can be known that, in this experimental example (see reference character b), ISI decreases and, thus the output data signal swings between about 360 mV and about 1080 mV regardless of the pattern of the input data signal. Furthermore, it can be known that the peak becomes higher as the resistances of first and second inductive peaking elements become higher.

According to the above-described output driver, one or more advantages are provided as follows.

First, ISI can be decreased by including inductive peaking elements in the output driver. Therefore, the generation of skew, which is dependent on the pattern of an input data signal, decreases, so that the timing margin and a voltage margin can increase in a receiver receiving the output data signal DOUT.

Second, the size of the output driver is small and power consumption thereof is small, compared to a conventional output driver in which a main driver and a pre-emphasis driver are connected in parallel.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An output driver comprising:
a pull-up unit including a pull-up element and a first inductive peaking element connected in series between a first voltage and an output node; and
a pull-down unit including a pull-down element and a second inductive peaking element connected in series between a second voltage and the output node,
wherein the pull-up and pull-down elements receive an input data signal and adjust a voltage level of the output node, and the first and second inductive peaking elements perform an inductive peaking operation when the input data signal transitions.

2. The output driver of claim 1, wherein the pull-up element is a first PMOS transistor, a gate of which receives the input data signal.

3. The output driver of claim 1, wherein the pull-down element is a first NMOS transistor, a gate of which receives the input data signal.

4. The output driver of claim 1, wherein the first inductive peaking element includes a first PMOS transistor which is connected between the pull-up element and the output node, and a gate of which is connected to the first voltage through a first capacitor, and a first resistor which is connected between the gate of the first PMOS transistor and the output node.

5. The output driver of claim 1, wherein the second inductive peaking element includes a first NMOS transistor which is connected between the pull-down element and the output node, and a gate of which is connected to the second voltage through a second capacitor, and a first resistor which is connected between the gate of the first NMOS transistor and the output node.

6. The output driver of claim 1, wherein the second inductive peaking element is a first PMOS transistor which is connected between the pull-down element and the output node, and a gate of which is connected to a fourth voltage through a second resistor.

7. The output driver of claim 6, wherein a level of a fourth voltage varies depending on a third pre-emphasis control signal.

8. The output driver of claim 6, wherein a level of a fourth voltage is lower than a level of the second voltage.

9. The output driver of claim 6, wherein the level of the fourth voltage is lower than the level of the second voltage by about 0.5~1 V.

10. The output driver of claim 1, wherein the first inductive peaking element is a first NMOS transistor which is connected between the pull-up element and the output node, and a gate of which is connected to a third voltage through a first resistor.

11. The output driver of claim 10, wherein a level of the third voltage is higher than a level of the first voltage.

12. The output driver of claim 11, wherein the level of the third voltage is higher than the level of the first voltage by about 0.5~1 V.

13. The output driver of claim 10, wherein a resistance of the first resistor varies depending on a second pre-emphasis control signal.

14. The output driver of claim 13, wherein the first resistor comprises a plurality of first sub-resistors connected in parallel, the plurality of first sub-resistors being selectively connected to the third voltage according to a second pre-emphasis control signal.

15. The output driver of claim 10, wherein the level of the third voltage varies depending on a first pre-emphasis control signal.

16. The output driver of claim 15, wherein a resistance of the second resistor varies depending on a fourth pre-emphasis control signal.

17. The output driver of claim 16, wherein the second resistor includes a plurality of second sub-resistors connected in parallel, the plurality of second sub-resistors being selectively connected to the fourth voltage according to the fourth pre-emphasis control signal.

18. An output driver comprising:
a first PMOS transistor which is connected between a first voltage and a first node, and a gate of which receives an input data signal;
a first NMOS transistor which is connected between a second voltage and a second node, and a gate of which receives the input data signal;
a second NMOS transistor which is connected between the first node and an output node, and a gate of which is connected to a third voltage through a first resistor; and
a second PMOS transistor which is connected between the second node and the output node, and a gate of which is connected to a fourth voltage through a second resistor.

19. The output driver of claim 18, wherein a level of the third voltage is higher than a level of the first voltage.

20. The output driver of claim 18, wherein a level of the third voltage varies depending on a first pre-emphasis control signal.

21. The output driver of claim 18, wherein a resistance of the first resistor varies depending on a second pre-emphasis control signal.

22. The output driver of claim 18, wherein a level of the fourth voltage is lower than a level of the second voltage.

23. The output driver of claim 18, wherein a level of the fourth voltage varies depending on a third pre-emphasis control signal.

24. The output driver of claim 18, wherein a resistance of the second resistor varies depending on a fourth pre-emphasis control signal.

* * * * *